United States Patent [19]

Hoppe et al.

[11] Patent Number: 4,956,696
[45] Date of Patent: Sep. 11, 1990

[54] COMPRESSION LOADED SEMICONDUCTOR DEVICE

[75] Inventors: Richard J. Hoppe; Steven E. Jackson; William K. Anderson, all of Rockford, Ill.

[73] Assignee: Sundstrand Corporation, Rockford, Ill.

[21] Appl. No.: 397,831

[22] Filed: Aug. 24, 1989

[51] Int. Cl.⁵ .......................................... H01L 23/42
[52] U.S. Cl. ........................................ 357/79; 357/81; 357/74; 357/38
[58] Field of Search ................. 357/79, 81, 74, 38, 357/38 C, 38 E

[56] References Cited

U.S. PATENT DOCUMENTS

| | | | |
|---|---|---|---|
| 3,536,966 | 10/1970 | Lewis | 317/234 |
| 3,931,635 | 1/1976 | Sundstrom | 357/79 |
| 3,992,717 | 11/1976 | Rice | 356/79 |
| 4,188,637 | 2/1980 | Gerstenkoper et al. | 357/79 |
| 4,305,087 | 12/1981 | Wislocky | 357/79 |
| 4,554,574 | 11/1985 | Wright | 357/79 |
| 4,607,275 | 8/1986 | Vogt et al. | 357/79 |
| 4,710,795 | 12/1987 | Nippert et al. | 357/79 |

FOREIGN PATENT DOCUMENTS

| | | | |
|---|---|---|---|
| 434482 | 10/1967 | Switzerland | |
| 0992472 | 5/1965 | United Kingdom | 357/79 |
| 1064522 | 4/1967 | United Kingdom | 357/79 |

Primary Examiner—Andrew J. James
Assistant Examiner—James W. Pemrick
Attorney, Agent, or Firm—Antonelli, Terry, Stout & Kraus

[57] ABSTRACT

A compression loaded semiconductor device package (40) in accordance with the invention includes a cylindrical semiconductor device (54) having a first region (66) on a first face, a control region (68) on the first face having a central portion (70) and a plurality of projections (72) extending radially from the central portion with the radial projections being symmetrically disposed around the periphery of the first face and a second region (74) on a second face with the second face being opposed to the first face; an electrically conductive contract (48) having an external control terminal (88), an annulus (84) electrically connected to the external control terminal, a plurality of projections (82) electrically connected to the annulus, projecting radially inward and a center (80) electrically connected to the radially inward projections and to the control region; and first and second annular insulators (112 and 114) each insulator having a plurality of faces, the upper cover being bonded to a first face (116) of the first insulator, a second face of the first insulator being bonded to a first attachment ring (122) with the first attachment ring being bonded to the annulus, the lower cover being bonded to a first face (116) of the second insulator, a second face (118) of the second insulator being bonded to a second attachment ring (124) with the second attachment ring being bonded to the annulus, the bonds (120) defining a sealed chamber containing the semiconductor device.

22 Claims, 5 Drawing Sheets

COMPRESSION LOADED SEMICONDUCTOR DEVICE

TECHNICAL FIELD

The present invention relates to a package for compression loaded semiconductor devices and more particularly to a low profile package for bipolar transistors for use in high power applications such as converters and inverters.

BACKGROUND ART

Hermetically sealed compression loaded bipolar transistor packages are known. FIG. 1 illustrates a commercial package of a disk-shaped compression loaded bipolar power transistor 12 which contains a thick metallic disk 14 which is electrically connected to the emitter region of the bipolar transistor through a molybdenum washer 16 which contacts the emitter region throughout the bottom surface of the transistor. The thick metallic disk 14 functions as an electrical contact and heat sink for the emitter. The thick metallic disk 14 contains a central aperture 18 and a radial projecting slot 20 extending from the central aperture to the exterior of the disk. Within the aperture 18 is an insulator 22 which contains a base contact 24. An electrical lead 26 extends from the base contact 24 through the slot outward through an annular ceramic member 28. Electrically conductive metallic top and bottom covers 30 and 32, respectively, are brazed to the top and bottom of the annular ceramic member. This construction, while operating satisfactorily as a high power transistor switch, has a number of disadvantages. First, the height of the annular ceramic member 28, which is necessary to provide sufficient electrical insulation to avoid electrical conduction between the base lead 26 and the top and bottom covers 30 and 32 to maintain proper electrical operation of the device in environments where conductive agents can coat the exterior surface of the ceramic member to cause electrical malfunction or failure of the transistor 12, contributes substantially to the overall height of the package 10. Furthermore, the presence of the thick metallic disk 14 in which the base contact 24 is disposed contributes substantially to the overall height and weight of the package 10.

Compression loaded bipolar transistor switches are also known which establish contact with the base on only the outer rim of the surface which contains the emitter.

In applications such as converters and inverters, a plurality of hermetically sealed transistor switches are stacked and compression loaded to complete electrical connections. Therefore, individual high profile hermetically sealed bipolar transistor switches are disadvantageous from a spatial consideration in that the height of the overall compression loaded stack is increased. Furthermore, the weight of the overall compression loaded stack is increased as a consequence of the aforementioned thick metallic disk 14.

Since high power bipolar transistor switches in converters and inverters have applications in airframes for use in variable speed constant frequency power generating systems (VSCF), any increased height in the profile of a hermetically sealed high power transistor switch and increased weight is disadvantageous given the premium of space in airframes and the disadvantage of increased weight in the overall operational efficiency of the airframe.

Semiconductor packages are disclosed in U.S. Pat. Nos. 3,536,966; 3,931,635; 4,188,637; 4,710,795 and Swiss Patent No. 434,482. U.S. Pat. No. 3,931,635 discloses a semiconductor device in which a control electrode of the semiconductor device extends through insulative rings. The use of an insulator in the sides of the power semiconductor device creates a high profile in which the height of the insulator substantially contributes to the overall height and weight of the semiconductor device which is disadvantageous in applications where weight and space are critical, such as airframes. FIGS. 11-13 of Swiss Patent No. 434,482 disclose a compression loaded controllable rectifier having identical cover lids 70 and 71 which are joined to ceramic rings 68 and 69. The ceramic rings have the disadvantage that they increase the thickness and weight of the semiconductor device. U.S. Pat. No. 3,536,966 discloses a semiconductor device having an annular insulator ring 26 through which extends a lead 14 of a control electrode. The annular insulator ring 26 adds to the overall height and weight of the semiconductor device.

DISCLOSURE OF INVENTION

The present invention provides a low profile package for semiconductor devices which does not have the weight and height disadvantages of the prior art discussed above, which is simple in construction, and which is inexpensive to manufacture.

In accordance with features of the invention, a package for a compression loaded high power switch such as a bipolar transistor achieves a lower profile than the prior art by electrically insulating the top and bottom covers from an annular control electrode of the semiconductor device by joining a pair of radially extending attachment rings to the annular control electrode, joining the pair of radially extending attachment rings respectively to a pair of radially projecting insulators and joining the radially projecting insulators respectively to the top or bottom covers of the sealed package which may be hermetically sealed. A lower profile is achieved by insulating between the control electrode and the top and bottom covers utilizing the radial dimension of the insulators instead of the height of the annular insulator in the prior art of FIG. 1.

A compression loaded semiconductor device package in accordance with the present invention includes a cylindrical semiconductor device having a first region on a first face, a control region on the first face having a central contact and a second region on a second face with the second face being parallel to and opposed to the first face; an upper cover in electrical contact with the first region of the semiconductor device; a lower cover in electrical contact with the second region of the semiconductor device; an electrically conductive contact having an external control terminal and annulus electrically connected to the external control terminal, a plurality of projections electrically connected to the annulus and projecting radially inward and a center electrically connected to the radially inward projections and to the central portion of the control region; first and second annular insulators, each annular insulator having a plurality of faces, the upper cover being bonded to a first face of the first insulator, a second face of the first insulator being bonded to a first attachment ring with the first attachment ring being bonded to the annulus, the lower cover being bonded to a first face of the second insulator, a second face of the second insulator being bonded to a second attachment ring with the second attachment ring being bonded to the annulus, the bonds defining a sealed chamber containing the semiconductor device. The control region further has a plurality of projections extending radially outward from the central portion with the radial projections being symmetrically disposed around the periphery of the first face and each of the projections projecting radially inward being in electrical contact with a different one of the radially outward extending projections of the control region. Preferably, the first and second faces of the insulators are inner and outer radially separated cylindrical surfaces. The semiconductor device is a bipolar transistor, the first region is an emitter, the control region is a base, and the second region is a collector.

The compression loaded semiconductor package of the present invention further includes a conductor disk interposed between the upper cover and the electrically conductive contact, the conductor disk being in electrical contact with an interior surface of the upper cover and having a plurality of radial slots and a central aperture, the plurality of radial slots and central aperture being aligned with the projections and the center of the electrically conductive contact so that the electrically conductive contact is spaced from the plurality of radial slots and central aperture so that the electrically conductive contact is electrically isolated from the conductor disk.

A base contact is contained in and electrically insulated from the central aperture of the conductor disk. Furthermore, a force mechanism is provided for isolating the conductor disk and the electrically conductive contact from forces applied to the upper and lower covers during compression loading of the package. The force isolation mechanism includes a spring bias contained within an aperture of the center of the electrical contact and the aperture of the conductor disk. The spring bias may be produced by at least one Bellevue washer formed into an assembly.

The semiconductor package of the present invention further includes an insulator interposed between the electrically conductive contact and the emitter region of the semiconductor device which contacts a surface of the conductor disk, the insulator including slots for accommodating the projections of the contact.

A compression loaded semiconductor device package in accordance with the invention comprises a cylindrical semiconductor device having a first region on a first face, a control region on the first face and a second region on a second face with the second face being parallel to and opposed to the first face, an upper cover in electrical contact with the first region of the semiconductor device; a lower cover in electrical contact with the second region of the semiconductor device; an electrically conductive contact having an external control terminal and an annulus electrically connected to the external control terminal and electrically coupled to the contact region, first and second annular insulators each having a plurality of faces, the upper cover being bonded to a first face of the first insulator, a second face of the first insulator being bonded to a first attachment ring with the first attachment ring being bonded to the annulus, the lower cover being bonded to a first face of the second insulator, a second face of the second insulator being bonded to a second attachment ring with the second attachment ring being bonded to the annulus, the bonds defining a sealed chamber containing the semiconductor device which preferably is a hermetically sealed chamber. Preferably, the first and second faces of the insulators are inner and outer radially separated cylindrical surfaces. Preferably, the semiconductor device is a bipolar transistor, the first region is an emitter, the control region is a base and the second region is a collector.

BEST MODE FOR CARRYING OUT THE INVENTION

Figures 1, 2:
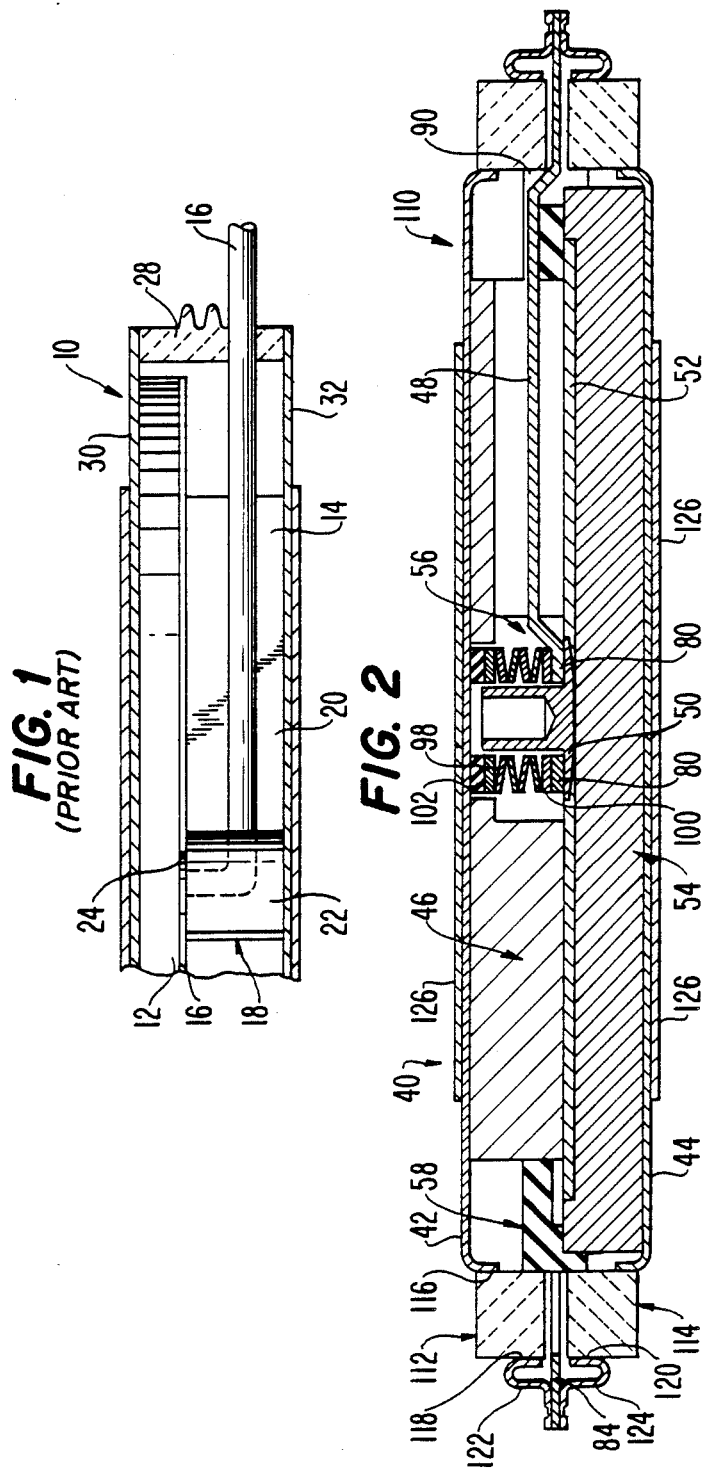
FIG. 1 is a cross-sectional view of a prior art high power compression loaded bipolar transistor.
FIG. 2 is a cross-sectional view of a lower profile high power compression loaded bipolar transistor constructed in accordance with the present invention.
Figure 3:
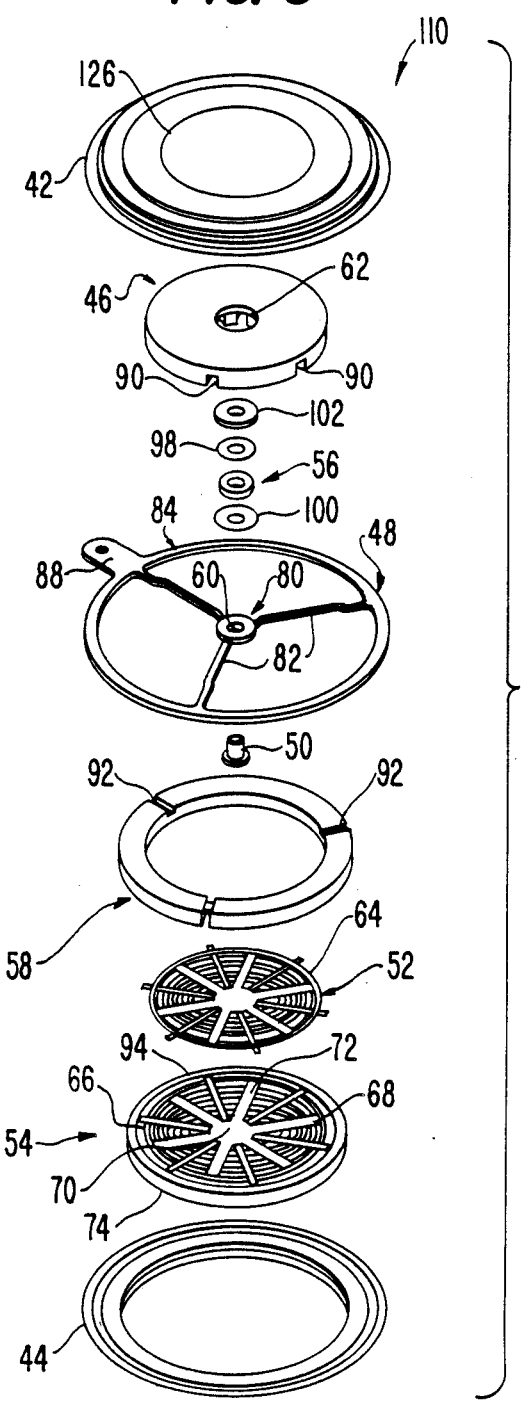
FIG. 3 is an exploded view of the package of FIG. 2.

FIGS. 2 and 3 illustrate a lower profile package 40 for a high power semiconductor device in accordance with the present invention. It should be understood that like reference numerals identify like parts throughout the drawings. Furthermore, while a preferred embodiment of the present invention provides a package for a bipolar transistor, it should be understood that other semiconductor devices may be contained within the package of the present invention without departing from the present invention. The package 40 includes upper and lower covers 42 and 44 respectively formed of an electrical conductor such as a nickel-plated copper. Interposed between the upper and lower covers 42 and 44 are an emitter conductor disk 46, a conductor 48, a base pin contact 50, a molybdenum emitter contact disk 52, and a cylindrical bipolar power transistor 54 which is a bipolar transistor of conventional design. A contact loading mechanism 56, which preferably is a spring, is disposed between the transistor 54 and the conductor 48. The contact loading mechanism 56 may be a Bellevue washer assembly. An annular insulator 58 electrically isolates and locates the conductor disk 46 and transistor 54 from the inner diameter of the first and second annular insulators 112 and 114. The conductor disk 46 is preferably formed from aluminum to provide high electrical conductivity between the upper cover 42 and the emitter of the transistor 54 and high thermal conductivity for the purpose of dissipating heat generated by the bipolar transistor as described below.

With reference to FIG. 3, the base pin contact 50 is contained in a central opening 60 of the conductor 48. The base contact pin 50 clears the central opening 62 of the conductor disk. The upper and lower covers 42 and 44, respectively, are of identical configuration. The contact loading mechanism 56, which comprises a stack of Bellevue washers 56, load distribution rings 98 and 100, load the base contact 70 of transistor 54 with the base contact pin 50. The contact loading mechanism 56 exerts a load of approximately 40 lb. on the base contact pin 50 which presses against the base contact 70 of transistor 54. Axial height is assured by a compression loading force of 1000-2000 psi being applied to the covers 42 and 44. The emitter contact disk 52 includes a plurality of sector-shaped emitter contactor areas 64 which are aligned with corresponding emitter regions 66 of the transistor 54 during assembly. The emitter contact disk 52 and transistor 54 are of conventional design. The alignment of the emitter contactor areas 64 of the contact disk 52 with the emitter regions 66 of the transistor 54 is conventional. The emitter regions 66 are separated from each other by a base region 68 which is comprised of a central portion 70 and a plurality of radially outward extending projections 72. The collector region 74 is on the surface of the transistor 54 which is opposed to the surface containing the emitter and base regions 66 and 68. The central portion 70 of the base is in electrical contact with the base contact pin 50 when the package is assembled.

With reference to FIGS. 2 and 3, in order to maintain parallelism, a stock disk 126 is disposed on the outer surface of the upper cover and lower covers 42 and 44 which is machinable to maintain absolute parallelism between the upper and lower covers. Absolute parallelism is important when a plurality of semiconductor packages in accordance with the present invention are being compression loaded together in a single stack.

Figure 4:
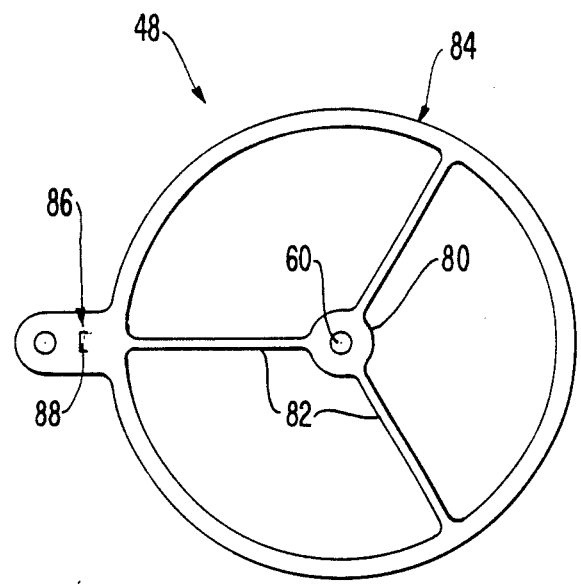
FIG. 4 is a plan view of a conductor for establishing electrical contact from outside of the package of the present invention to the base of a bipolar transistor contained within the switch package.

With reference to FIG. 4, the conductor 48 has a centrally located hub 80 and a plurality of symmetrically disposed radially outward extending projections (spokes) 82 which terminate in an outer annulus 84. The symmetrical distribution of the projections 82 improves the heat dissipation from the emitter region 66 of the transistor as a consequence of the projections being as narrow as the radially outward extending regions 72 which permits maximum surface area contact of the emitter conductor disk 46 with the contact areas 64 of the contact disk 52. A base conductor lug 86 is formed on the outer periphery of the annulus 84. Suitable indicia, such as the letter "E" (for emitter), is provided on one side of the surface 88 of the conductor lug 86 to facilitate orientation after final assembly of the face of the conductor bearing the "E" with respect to the emitter regions 66 of the transistor 54. Preferably, the conductor 48 is made of a nickel plated copper or protective plated conductor material.

The emitter conductor disk 46, the biasing mechanism 56, the conductor 48, base pin contact 50, and insulator 58 reduce the overall height of the package by fitting together as an assembly as illustrated most clearly with reference to FIGS. 2 and 3. The emitter conductor disk 46 is provided with a plurality of circumferentially spaced notches 90 and the insulator 58 is provided with a plurality of circumferentially spaced notches 92. The notches 90 and 92 correspond in number to the number of projections 82 of the conductor 48. The symmetrical disposition of the projections 82 permits minimizing the width of the notches 90 and 92 which improves the thermal and electrical conductivity from the emitter 66 through the contact disk 46 and further improves the mechanical loading properties of transferring the forces during compression loading from the top and bottom covers 42 and 44 to the emitter and collector regions 66 and 74 of the transistor 54. The outer diameter of the conductor disk 46 is smaller than the inner diameter of the annulus 84 of the conductor 48 so that when assembled the annulus of the conductor is electrically isolated from the outer periphery of the conductor disk 46 and is brought into surface contact with the top surface of the contract disk 52 and the semiconductor device 54. The projections 82 of the conductor 48 in the final assembly are aligned with the notches 90 and 92 which distribute the mechanical load away from the central radially outward extending base regions 70 and 72 and maximize loading on the emitter 66 to provide good thermal and electrical contact.

Figure 5:
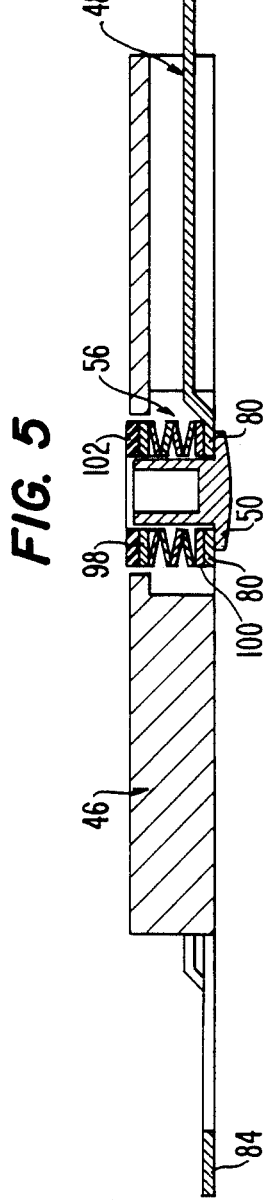
FIG. 5 is a cross-sectional view of the conductor for establishing electrical contact from the exterior of the package to the base of the bipolar transistor within the package.

The base pin contact 50 is interposed within apertures 60 of the conductor 48 and 62 of the conductor disk 46. The base pin contact 50 is electrically isolated from the conductor disk 46 and is in electrical contact with the hub 80 of the conductor 48. As illustrated in FIGS. 2 and 5, washers 98 and 100 are disposed on respective sides of the biasing mechanism 12 with an insulator washer 102 being interposed between the washer 98 and the contactor disk 46.

Figure 6:
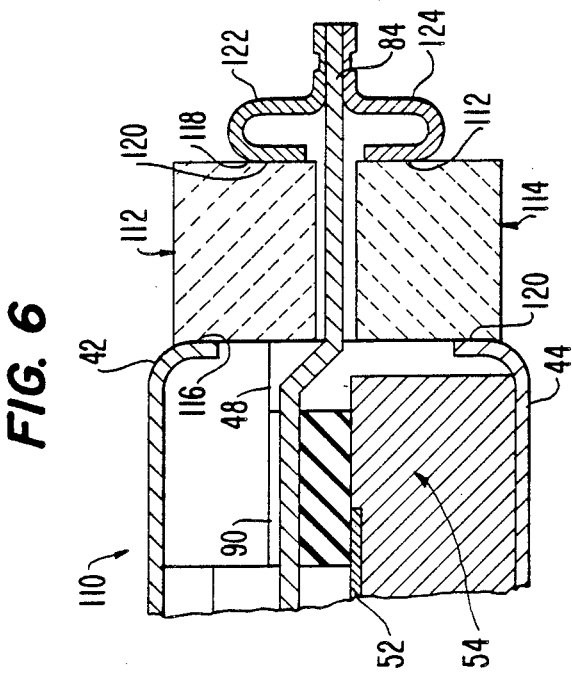
FIG. 6 is a partial sectional view of the peripheral portion of the package of the present invention.

FIG. 6 illustrates an enlargement of the peripheral portion 110 of the semiconductor package 40 of the present invention. The design of the peripheral portion 110 of the semiconductor package plays an important part in the present invention in reducing the height of the semiconductor package which is of importance for applications such as airframes where spatial considerations are of importance. As illustrated, first and second annular insulators 112 and 114 provide electrical insulation respectively between the upper cover 42 and the lower cover 44 and the conductor 48. The first and second annular insulators 112 and 114 are preferably ceramic rings having a metallized inner cylindrical surface 116 and a metallized outer cylindrical surface 118. For high power applications in which high voltages are switched by the transistor 54, it is important to provide sufficient insulation between the top and bottom covers 42 and 44 and the base conductor 48, which are respectively electrically coupled to the emitter, collector and base of the transistor. Sufficient insulation is provided by the radial thickness of the ceramic separating the inner cylindrical surface 116 and the outer cylindrical surface 118 of the insulator rings 112 and 114. Without a minimum path length of insulator on the exterior of the insulator rings 112 and 114 separating the upper cover 42, lower cover 44 and the base conductor 48, respectively, electrically conductive agents could lead to formation of conductive tracks when high potentials are switched causing electrical leakage between or shorting of the base and the emitter or collector regions of the transistor 54. This necessary exterior path length is obtained by the radial thickness of the annular insulators 112 and 114 which does not substantially contribute to the height of the overall package 40. Accordingly, the height of the package may be reduced from the prior art of FIG. 1 as a consequence of a hermetic seal between the upper and lower covers 42 and 44 being achieved by a brazed joint 120 at the interface of the inner cylindrical surface 116 at the upper and lower covers 42 and 44, respectively, and a brazed joint 120 between the outer cylindrical surface 118 of the upper and lower covers to metallic attachment rings 122 and 124 which are attached to the annulus 84. The connection together of the attachment rings 122 and 124 to the annulus 84 is by a cold weld which may be achieved by cold metal deformation such as cold welding or crimping. The utilization of the cold metal deformation permits the final hermetic seal to be made without the application of heat which could damage the semiconductor element or other elements within the package.

The lowered profile of the present invention is achieved by the providing of the insulation separating the base and the emitter and collectors across a radial dimension separating the base from the emitter and collector. Furthermore, usage of identical top and bottom covers lowers manufacturing cost.

Figure 7:
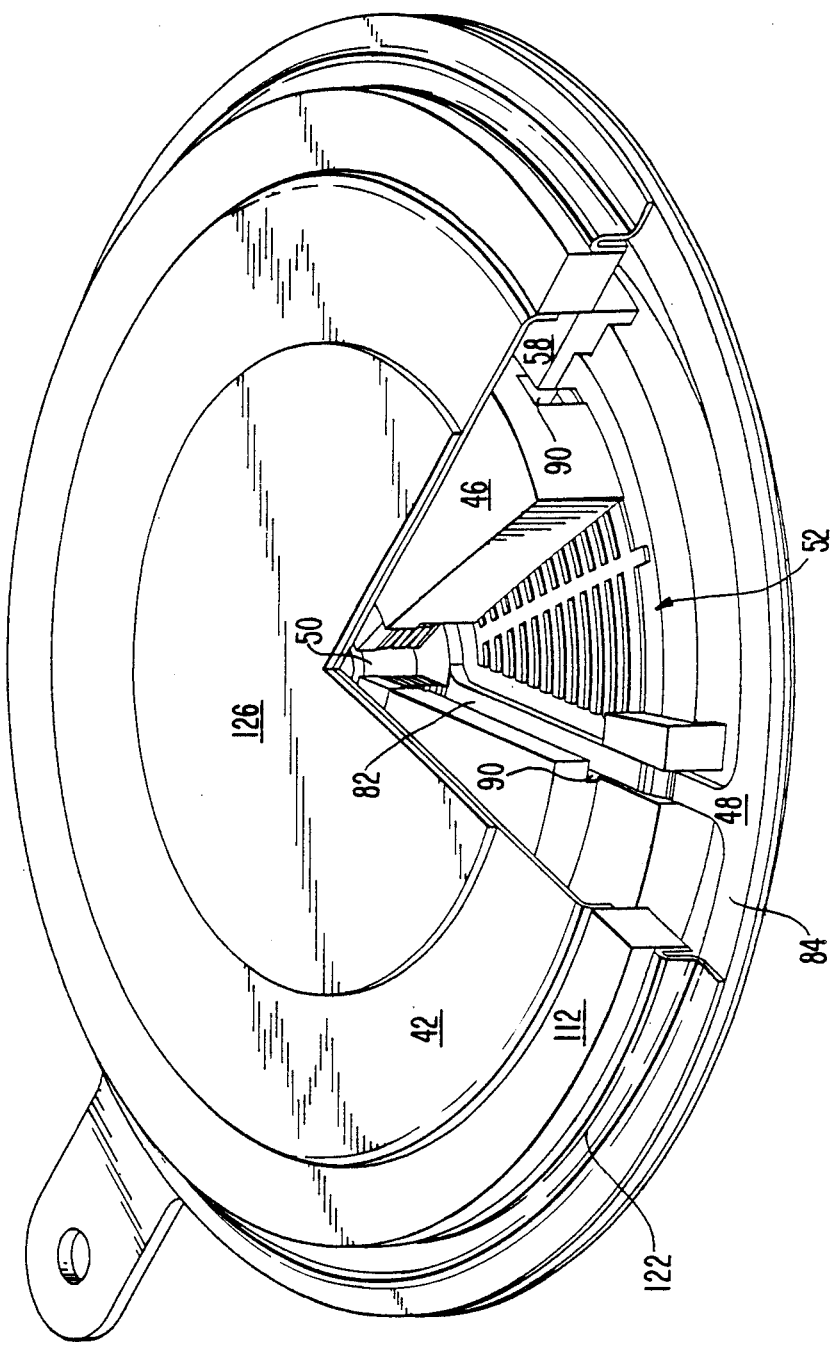
FIG. 7 is a perspective view illustrating a partial section of the present invention.

FIG. 7 illustrates a perspective view illustrating a partial section of the present invention containing a high power bipolar transistor of the type used in inverters in VSCF systems. Like reference numerals identify like parts in FIGS. 2-7.

It should be understood that the present invention may be practiced with bipolar transistors which have only an outer peripheral base contact. In this case the annulus 84 would establish base contact. The projections 82, hub 80 and base contact 50 would not be used.

While the invention has been described in terms of its preferred embodiments, it should be understood that numerous modifications may be made thereto without departing from the spirit and scope of the invention as defined in the appended claims. It is intended that all such modifications fall within the scope of the appended claims.

We claim:

1. A compression loaded semiconductor device comprising:
   a cylindrical semiconductor device having a first region on a first face, a control region on the first face having a central portion and a second region on a second face with the second face being opposed to the first face;
   an upper cover in electrical contact with the first region of the semiconductor device;
   a lower cover in electrical contact with the second region of the semiconductor device;
   an electrically conductive contact having an external control terminal, an annulus electrically connected to the external control terminal, a plurality of projections electrically connected to the annulus and projecting radially inward, and a center connected to the radially inward projections and to the central portion of the control region; and
   first and second annular insulators, each annular insulator having a plurality of faces, the upper cover being bonded to a first face of the first insulator, a second face of the first insulator being bonded to a first attachment ring with the first attachment ring being bonded to the annulus, the lower cover being bonded to a first face of the second insulator, a second face of the second insulator being bonded to a second attachment ring with the second attachment ring being bonded to &he annulus, the bonds defining a sealed chamber containing the semiconductor device.

2. A compression loaded semiconductor device in accordance with claim 1 wherein:
   the control region has a plurality of projections extending radially outward from the central portion with the radial projections being symmetrically disposed around the periphery of the first face; and
   each of the projections projecting radially inward are in electrical contact with a different one of the radially outward extending projections of the control region.

3. A compression loaded semiconductor device package in accordance with claim 2 wherein:
   the first and second faces of the insulators are inner and outer radially separated cylindrical surfaces.

4. A compression loaded semiconductor device package in accordance with claim 3 wherein:
   the semiconductor device is a bipolar transistor, the first region is an emitter, the control region is a base, and the second region is a collector.

5. A compression loaded semiconductor device package in accordance with claim 4 further comprising:
   a conductor disk interposed between the upper cover and the electrically conductive contact, the conductor disk being in electrical contact with an interior surface of the upper cover and having a plurality of radial slots and a central aperture, the plurality of radial slots and central aperture being aligned with the projections and the center of the electrically conductive contact so that the electrically conductive contact is spaced from the plurality of radial slots and central aperture so that the electrically conductive contact is electrically isolated from the conductor disk.

6. A compression loaded semiconductor device package in accordance with claim 5 further comprising:
   a base contact contained in and electrically insulated from the central aperture of the conductor disk; and
   means for isolating the base contact from forces applied to the upper and lower covers during compression loading of the transistor in the package.

7. A compression loaded semiconductor device package in accordance with claim 6 further wherein:
   the means for isolating includes a biasing means contained within an aperture of the center of the electrically conductive contact and the aperture of the conductor disk for applying a force between the control region and the electrically conductive contact.

8. A compression loaded semiconductor package in accordance with claim 7 wherein:
   the biasing means comprises at least one Bellevue washer.

9. A compression loaded semiconductor in accordance with claim 7 further comprising:
   an insulator interposed between the electrically conductive contact and an emitter region of the semiconductor device which contacts a surface of the semiconductor disk, the insulator including slots for accommodating the projections of the electrically conductive contact.

10. A compression loaded semiconductor device in accordance with claim 1 wherein:
    the bonds define a hermetically sealed chamber.

11. A compression loaded semiconductor device in accordance with claim 2 wherein:
    the bonds define a hermetically sealed chamber.

12. A compression loaded semiconductor device in accordance with claim 3 wherein:
    the bonds define a hermetically sealed chamber.

13. A compression loaded semiconductor device in accordance with claim 4 wherein:
    the bonds define a hermetically sealed chamber.

14. A compression loaded semiconductor device in accordance with claim 5 wherein:
    the bonds define a hermetically sealed chamber.

15. A compression loaded semiconductor device in accordance with claim 6 wherein:
    the bonds define a hermetically sealed chamber.

16. A compression loaded semiconductor device in accordance with claim 7 wherein:
    the bonds define a hermetically sealed chamber.

17. A compression loaded semiconductor device in accordance with claim 8 wherein:
the bonds define a hermetically sealed chamber.

18. A compression loaded semiconductor device in accordance with claim 9 wherein:
the bonds define a hermetically sealed chamber.

19. A compression loaded semiconductor device comprising:
a cylindrical semiconductor device having a first region on a first face, a control region on the first face and a second region on a second face with the second face being opposed to the first face;
an upper cover in electrical contact with the first region of the semiconductor device;
a lower cover in electrical contact with the second region of the semiconductor device;
an electrically conductive contact having an external control terminal and an annulus electrically connected to the external control terminal and electrically coupled to the control region; and
first and second annular insulators each having a plurality of faces, the upper cover being bonded to a first face of the first insulator, a second face of the first insulator being bonded to a first attachment ring with the first attachment ring being bonded to the annulus, the bonds defining a sealed chamber containing the semiconductor device.

20. A compression bonded semiconductor device in accordance with claim 19 wherein:
the first and second faces of the insulators are inner and outer radially separated cylindrical surfaces.

21. A compression loaded semiconductor device in accordance with claim 20 wherein:
the semiconductor device is a bipolar transistor, the first region is an emitter, the control region is a base, and the second region is a collector.

22. A compression loaded semiconductor device in accordance with claim 21 wherein:
the bonds define a hermetically sealed chamber.

* * * * *